United States Patent [19]
Ikeda

[11] Patent Number: 4,743,852
[45] Date of Patent: May 10, 1988

[54] COIL FOR NMR PROBE
[75] Inventor: Hiroshi Ikeda, Tokyo, Japan
[73] Assignee: Jeol Ltd., Tokyo, Japan
[21] Appl. No.: 50,502
[22] Filed: Apr. 14, 1987

Related U.S. Application Data

[63] Continuation of Ser. No. 714,580, Mar. 21, 1985, abandoned.

[30] Foreign Application Priority Data

Mar. 30, 1984 [JP] Japan ................... 59-62674

[51] Int. Cl.$^4$ ........................................... G01R 33/20
[52] U.S. Cl. ..................................................... 324/318
[58] Field of Search ............... 324/300, 307, 309, 318, 324/319, 322; 128/653

[56] References Cited

U.S. PATENT DOCUMENTS 3,953,789  4/1976  Veeman et al. ................ 324/322
4,362,993 12/1982  Young et al. .................. 324/309
4,398,149  8/1983  Zens ............................. 324/319
4,506,224  3/1985  Krause .......................... 324/319
4,563,648  1/1986  Hill .............................. 324/318
4,594,566  6/1986  Maudsley ...................... 324/318

Primary Examiner—Michael J. Tokar
Assistant Examiner—Kevin D. O'Shea
Attorney, Agent, or Firm—Webb, Burden, Robinson & Webb

[57] ABSTRACT

In NMR spectrometers, a probe coil has been disposed close to a sample that is placed in a uniform polarizing magnetic field. Conventionally, this coil has comprised several turns which are wound on the curved surface of a cylindrical sample region. The present invention provides a probe coil having an odd number of turns and capable of detecting signals with high sensitivity. The probe coil can be made to have an inductance best suited to the purpose of the observation.

8 Claims, 3 Drawing Sheets

COIL FOR NMR PROBE

DESCRIPTION

This application is a continuation of application Ser. No. 714,580, filed Mar. 21, 1985, abandoned.

BACKGROUND OF THE INVENTION

The present invention relates to a coil for use in the probe of a nuclear magnetic resonance spectrometer and, more particularly, to a coil structure that is very sensitive.

In an NMR spectrometer, a probe holds a sample placed in a uniform polarizing magnetic field. A coil is disposed close to the sample within the probe to apply an exciting RF magnetic field to the sample. The resultant resonance signal from the sample is picked up by the coil, and then it is fed to a receiver circuit. The output from the receiver circuit is furnished to a computer, which takes the Fourier transform of the signal to obtain an NMR spectrum. The sensitivity of the NMR spectrometer, which operates in this way, depends to a large measure on the degree of coupling between the coil and the sample. Therefore, great care is taken in designing the shape and structure of the coil. An NMR spectrometer employing a superconductive magnet has typically used a cylindrical saddle coil as shown in FIG. 1, where two spiral coil turns 1 and 2 are symmetrically arranged about the axis Z of a cylinder and on the curved surface of the cylinder of a radius R in which a sample tube holding a sample is diposed. The coil portion 1 consists of a pair of straight turns 1A extending parallel to the axis Z and a pair of arc-shaped portions 1B lying in the plane that is perpendicular to the axis Z. Similarly, the coil turn 2 consists of a pair of straight portions 2A and a pair of arc-shaped portions 2B. FIG. 2 is a cross-sectional view of the straight portions 1A and 2A taken on a plane perpendicular to the axis Z. It can be seen from this figure that the pairs of straight portions 1A and 2A are disposed on the periphery of the circle of the radius R in a symmetrical relation with respect to Y plane containing the axis Z. These coil portions set up an RF magnetic field in a plane which is parallel to X plane, contains the axis Z, and meets the Y plane at right angles.

The concept that underlies the prior art coil as mentioned above is that two spiral coil portions 1 and 2 of the same shape are disposed on the curved surface of a cylinder in a symmetrical relation with respect to the Y plane. Consequently, the number of turns of such a coil is 2, 4, 6, 8, or other even numbers. The prior art technique described thus far is disclosed in U.S. Pat. No. 4,398,149. In this respect, such an undesirable situation often takes place that two turns are not sufficient but four turns are excessive because of the relation of the resonance frequency to the inductance of the coil. If such a situation occurs, either a probe having two turns of coil or a probe having four turns of coil must be selected, giving unsatisfactory results.

SUMMARY OF THE INVENTION

It is the main object of the present invention to provide an odd number, such as 3, 5, or 7, of turns of coil.

It is another object of the invention to provide a coil that is quite excellent in sensitivity.

These objects are achieved in accordance with the teachings of the invention by a probe having windings which are disposed on the lines on which the Y plane intersects the curved surface of a cylinder, unlike the prior art probe, whereby doubling the number of choices that can be selected as the number of turns.

The coil according to the invention is wound around a cylindrical sample region to produce an RF magnetic field in a direction perpendicular to the axis Z of the cylinder. The coil comprises a plurality of nonmagnetic and electrically conductive straight portions extending parallel to the axis Z and arc-shaped, nonmagnetic and electrically conductive portions which connect the straight portions in series to form the coil. The number of pairs of straight portion or portions is $2n+1$, where n is an integer equal to or greater than 1. The straight portions are into groups within which they are substantially equally spaced apart from each other on the curved surface of the cylinder. Straight portions that they are that the first-mentioned and last-mentioned straight portion or portions are symmetrical with respect to the axis Z.

Other objects and features of the invention will appear in the course of the description that follows.

PREFERRED EMBODIMENTS OF THE INVENTION

Figure 1:
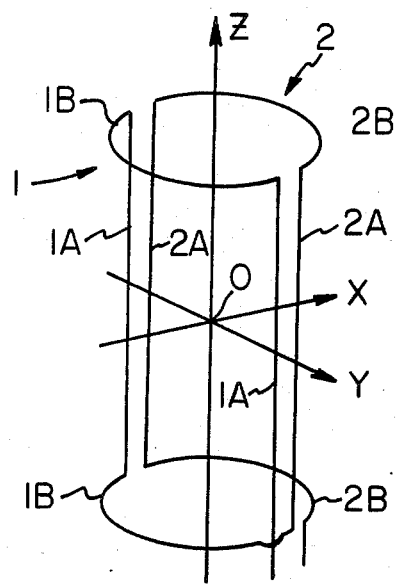
FIGS. 1 and 2 are representations of a conventional saddle coil of an even number of turns.
Figure 2:
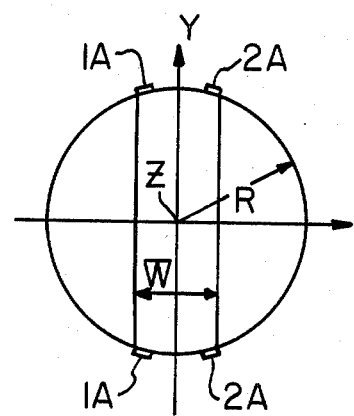
Figure 3A:
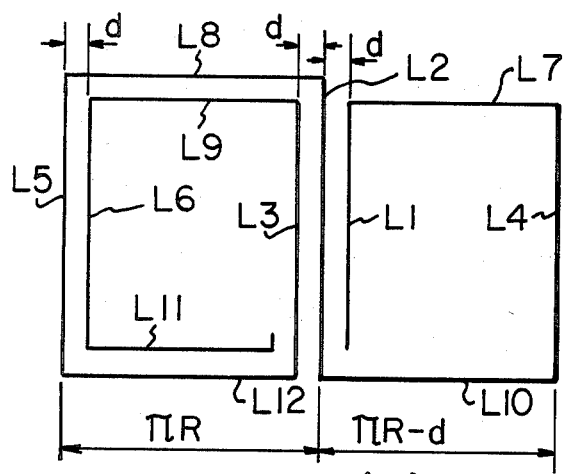
FIGS. 3(a) and 3(b) are representations of a coil of three turns according to the present invention.
Figure 3B:
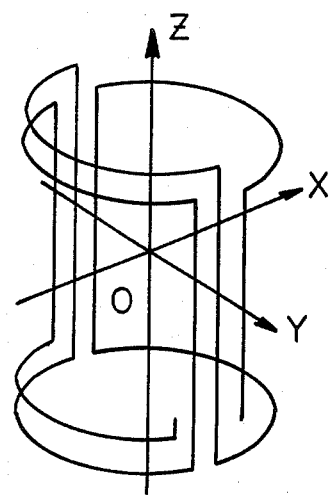
Figure 4:
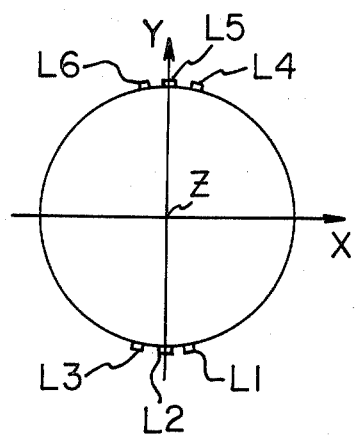
FIG. 4 shows the manner in which the straight portions of the coil shown in FIGS. 3(a) and 3(b) are arranged about axis Z.

A coil embodying the concept of the present invention is formed by stamping out a structure as shown in FIG. 3(a) from an electrically conductive sheet, and then shaping it into a cylindrical form as shown in FIG. 3(b). It is to be noted that these figures and many following figures show only the central position of each coil by solid lines, rather than its contour. In FIGS. 3(a) and 3(b), the coil consists of straight portions L1–L6 extending parallel to the axis Z of a cylinder together with arc-shaped portions L7–L12 which connect the straight portions in series to form the coil. The straight and arc-shaped portions are grouped together to form an odd number of turns as follows: (L1, L7, L4, L10) and (L2, L8, L5, L12) and (L3, L9, L6, L11). It is now assumed that the radius of the cylinder is R. As shown in FIG. 3(a), the arc-shaped portion L8 which connects the straight portion L2 to the straight portion L5 has a length of $\pi R$. The straight portions L2 and L1, L2 and L3, and L5 and L6 are equally spaced apart a distance of d. The length of the arc-shaped portion L10 is set to $\pi R - d$. When these portions are shaped into a cylinder, the straight portions L1–L6 are arranged about the axis Z of the cylinder as shown in FIG. 4. Thus, a coil is formed which has three turns within a width W, unlike the prior art coil of FIG. 2 in which only two turns are arranged. The added one turn is formed by the straight portions L2 and L5 which are disposed on the Y plane perpendicular to the axis X of the RF magnetic field. The RF magnetic field is produced in the direction of the X axis around the center, or the origin O, of the cylindrical region in which a sample is placed. The straight portions L2 and L5 disposed in this way experience a stronger magnetic field than any other straight portions arranged in other locations. Hence, the novel coil exhibits a larger Q. Therefore, according to the invention, it is possible to apply a stronger RF magnetic field to a sample using an efficient coil which exhibits a larger Q. Further, the resultant stronger resonance signal can be detected efficiently. The combination of these effects enhances the sensitivity of the NMR spectrometer greatly.

Figure 5:
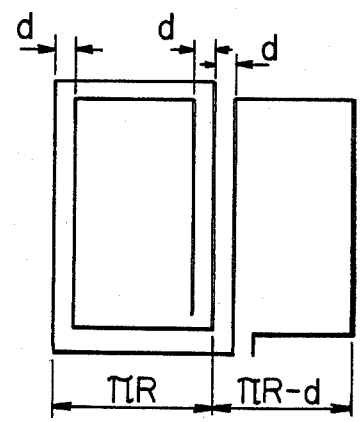
FIGS. 5-7 are representations of other coils according to the invention.

Referring to FIG. 5, another probe coil having three turns is schematically shown. This coil is wound in a manner different from the above-described coil. The turns of the coil are equally spaced a distance of d as shown.

Figure 6:
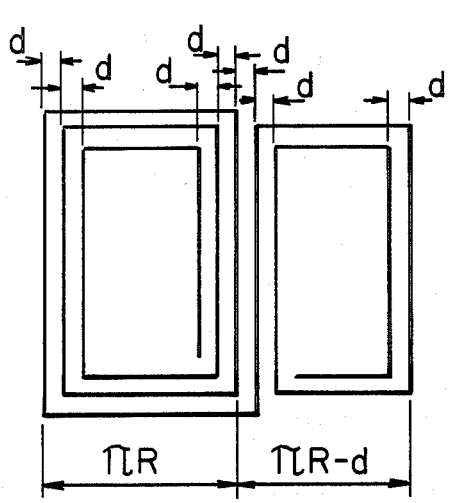
Figure 7:
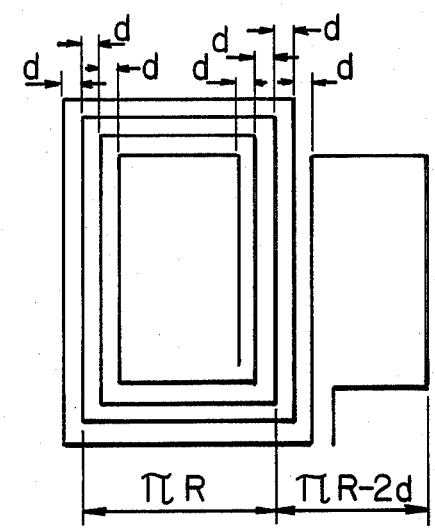

FIGS. 6 and 7 are plan views of coil portions which are used to fabricate probe coils having five turns in accordance with the invention.

The novel coil can be formed by stamping out a desired form from a sheet as mentioned already. It can be made in a different manner. For example, it may be fabricated by sticking electrically conductive wires of circular cross section on a bobbin. Also, it may be built on a bobbin by evaporation technique. Further, it may be produced as a printed circuit on a substrate which may or may not exhibit flexibility.

The symmetry of the arrangement of the coil is essential to minimize the disturbance of the homogeneity of the polarizing magnetic field which is caused by the existence of the coil. In the present invention, the number of the straight portions on each side is an odd number which is equal to or greater than three. Accordingly, the arc-shaped portions that are used to connect the straight portions are also odd in number. Thus, the arc-shaped portions are not symmetrical with respect to the Y plane. This may make it impossible to reduce the magnetic susceptibility of the coil portions to zero or substantially zero. In this case, the asymmetry of the arrangement of the arc-shaped portions may disturb the homogeneity of the polarizing field.

Figure 8:
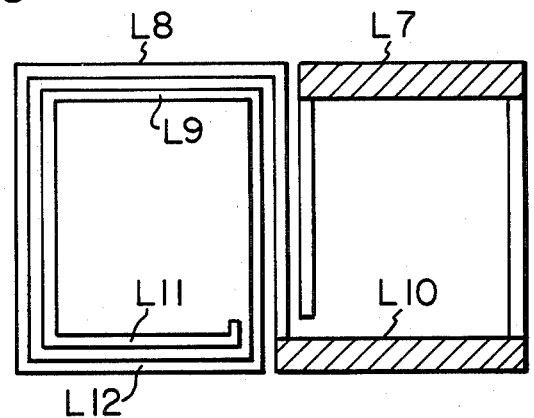
FIGS. 8-11 are representations of still other coils according to the invention, the coils having been manufactured by taking into account the symmetry of the arrangement of the arc-shaped conductors.

Referring next to FIG. 8, there is shown a still other coil which is similar to FIG. 3 except that it has been fabricated by taking account of the above consideration. FIG. 8 is a schematic representation of a planar plane form that has been stamped from a sheet. In this example, arc-shaped portions L7 and L10 are made wider as indicated by the hatching by taking the presence of arc-shaped portions L8 and L11 into consideration. The arrangement of the arc-shaped portions is made symmetrical. Therefore, the homogeneity of the polarizing magnetic field will not be disturbed.

Figure 9:
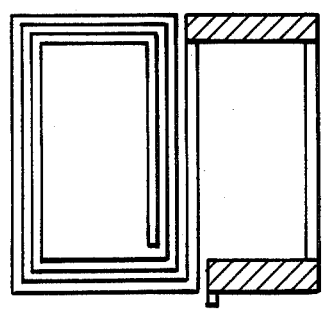
Figure 10:
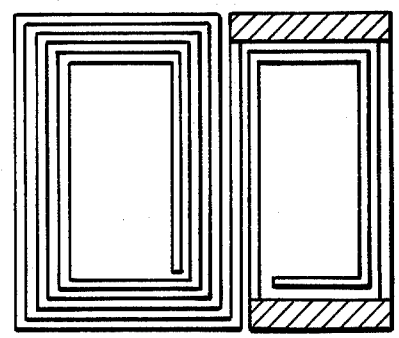
Figure 11:
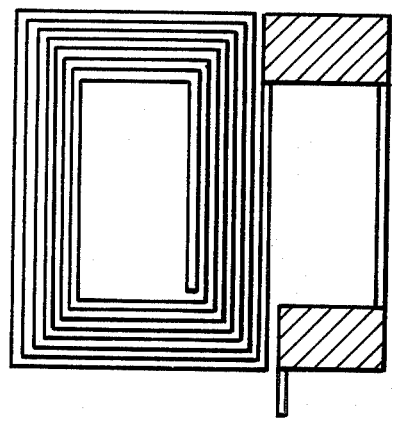

FIGS. 9, 10, and 11 are plan views of coil portions which correspond to the coils of FIGS. 5, 6, and 7, respectively, but in which the arrangement of the arc-shaped portions are rendered symmetrical in the same manner as the example described just above.

Figure 12A:
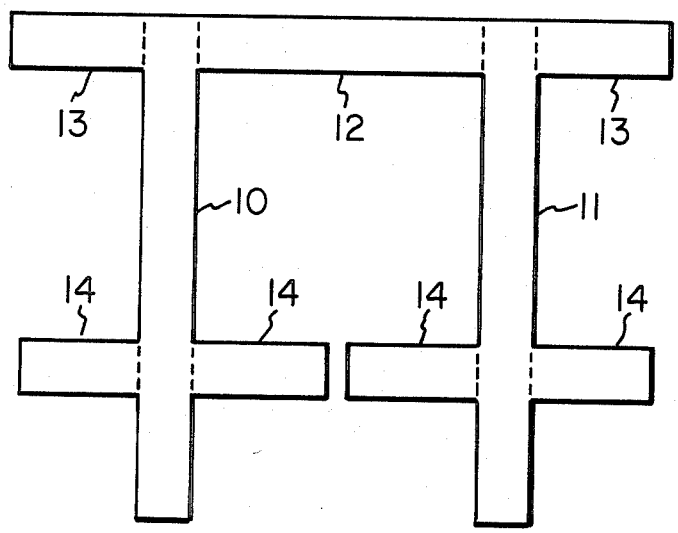
FIGS. 12(a) and 12(b) are representations of a coil of one turn according to the invention.
Figure 12B:
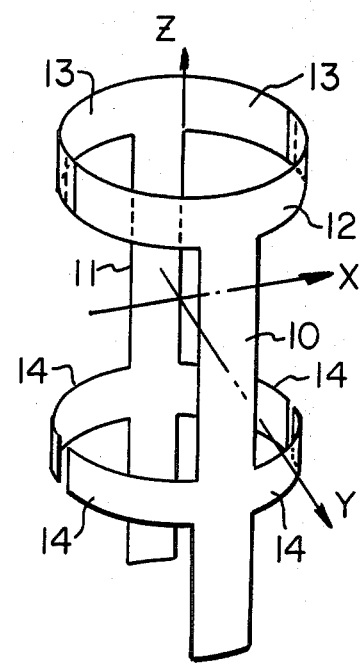

FIG. 12(a) shows the planar form of a coil member which has been stamped out of an electrically conductive sheet to obtain a coil having one turn. FIG. 12(b) shows the manner in which the coil having one turn has been assembled from the coil member shown in FIG. 12(a). In these figures, portions such as 13 and 14 other than the portions 10 and 11 forming the straight portions and the arc-shaped portions 12 are unnecessary per se, but the former portions made of the same material as the latter coil portions are placed at positions diametrically opposite to the center of the sample from the arc-shaped portions 12 to improve the symmetry of the coil portions about the center of the sample.

Figure 13A:
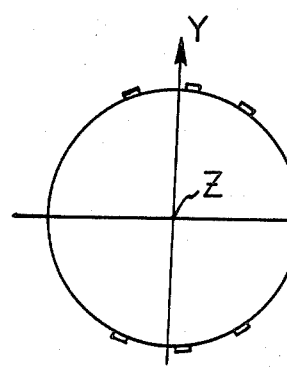
FIGS. 13(a) and 13(b) are representations of a coil in which the straight portions are disposed slightly asymmetrically.
Figure 13B:
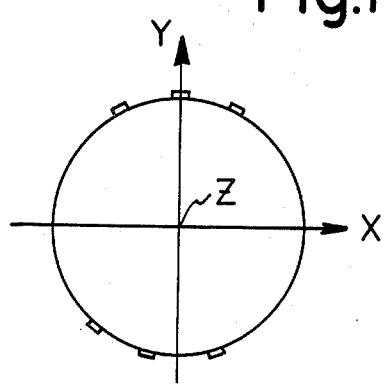

In the above examples, the straight portions are disposed exactly symmetrically about the axis Z, but it suffices to dispose the straight portions substantially symmetrically. For example, slight deviation from the exact symmetry as shown in FIGS. 13(a) and 13(b) is allowed.

I claim:

1. An NMR probe coil wound on the curved surface of a cylindrical sample region and consisting of a plurality of nonmagnetic and electrically conductive straight portions extending parallel to the axis Z of the cylinder and arc-shaped, nonmagnetic and electrically conductive portions which connect the straight portions in series and which produce an RF magnetic field in the direction of an X axis perpendicular to the axis Z, the straight portions being arranged in pairs with each pair being joined by an arc-shaped portion, one straight portion of each pair being on the opposite side of a plane defined by the X and Z axes from the other straight portion in the pair, and one pair intersecting the Y axis, the number of pairs of the straight portions being $2n+1$, where n is an integer equal to or greater than 1, the straight portions being in two groups within which they are substantially equally spaced apart from each other on the curved surface of the cylinder, said straight portions being arranged on the curved surface of the cylinder such that they are substantially symmetrical with respect to the axis Z.

2. The NMR probe coil of claim 1, wherein each of the straight portions is a conductor having a circular cross section.

3. The NMR probe coil of claim 1, wherein each of the straight portions is a piece of a sheet.

4. The NMR probe coil of claim 1, wherein the straight portions and the arc-shaped portions are supported on a bobbin of a hollow cylinder.

5. The NMR probe coil of claim 4, wherein the straight portions and the arc-shaped portions are formed on the bobbin by evaporation.

6. The NMR probe coil of claim 1, wherein the straight portions and the arc-shaped portions are formed by a printed circuit that is supported by an insulating substrate.

7. The NMR probe coil of claim 6, wherein the insulating substrate is flexible and can be bent.

8. The NMR probe coil of claim 1, wherein the straight portions and the arc-shaped portions are mechanically strong enough to support themselves.

* * * * *

UNITED STATES PATENT AND TRADEMARK OFFICE
CERTIFICATE OF CORRECTION

PATENT NO. : 4,743,852

DATED : May 10, 1988

INVENTOR(S) : Hiroshi Ikeda

It is certified that error appears in the above-identified patent and that said Letters Patent is hereby corrected as shown below:

Column 1 Line 47 "portions" should read --turns--.

Column 2 Line 14 "into" should read --in two--.

Column 2 Line 17 delete "they" and delete "that".

Signed and Sealed this

Twentieth Day of December, 1988

*Attest:*

DONALD J. QUIGG

*Attesting Officer*  *Commissioner of Patents and Trademarks*